United States Patent
Bushmaker et al.

(10) Patent No.: US 11,056,647 B2
(45) Date of Patent: Jul. 6, 2021

(54) ION-BASED NANOELECTRIC MEMORY

(71) Applicant: The Aerospace Corporation, El Segundo, CA (US)

(72) Inventors: Adam W. Bushmaker, El Segundo, CA (US); Don Walker, Whittier, CA (US)

(73) Assignee: The Aerospace Corporation, El Segundo, CA (US)

( * ) Notice: Subject to any disclaimer, the term of this patent is extended or adjusted under 35 U.S.C. 154(b) by 286 days.

(21) Appl. No.: 15/661,667

(22) Filed: Jul. 27, 2017

(65) Prior Publication Data

US 2018/0212144 A1 Jul. 26, 2018

Related U.S. Application Data

(60) Provisional application No. 62/449,995, filed on Jan. 24, 2017.

(51) Int. Cl.
*H01L 45/00* (2006.01)
*H01L 51/00* (2006.01)
(Continued)

(52) U.S. Cl.
CPC ...... *H01L 45/1206* (2013.01); *G11C 13/0069* (2013.01); *G11C 13/025* (2013.01); *H01L 45/08* (2013.01); *H01L 45/122* (2013.01); *H01L 45/149* (2013.01); *H01L 45/1641* (2013.01); *H01L 51/0048* (2013.01); *G11C 2013/008* (2013.01); *G11C 2013/009* (2013.01); *G11C 2213/16* (2013.01); *G11C 2213/17* (2013.01);
(Continued)

(58) Field of Classification Search
CPC .. H01M 4/661; H01M 45/1206; H01M 45/08; H01M 45/122; H01M 45/149; H01M 45/1641; H01M 51/0048; H01M 45/1226; H01M 45/1233; H01M 45/126; H01M 45/1273; H01M 51/0508; C25D 1/04; C25D 3/38; C25D 5/08; C25D 7/0614; G11C 13/0069; G11C 13/025; G11C 2013/009; G11C 2213/16; G11C 2213/17
See application file for complete search history.

(56) References Cited

U.S. PATENT DOCUMENTS

| 6,548,825 B1 * | 4/2003 | Yoshii | B82Y 10/00 257/24 |
| 2005/0079659 A1 * | 4/2005 | Duan | B82Y 10/00 438/197 |

(Continued)

OTHER PUBLICATIONS

Adam W. Bushmaker, et al., "Radiation Effects from Proton Radiation in Carbon Nanotube Field Effect Transistors" The Aerospace Corporation and the University of Southern California (2015).

(Continued)

*Primary Examiner* — Helen Oi K Conley
(74) *Attorney, Agent, or Firm* — LeonardPatel PC

(57) ABSTRACT

A carbon nanotube (CNT) single ion memory (or memory device) may include a mobile ion conductor with a CNT on one side and an ion drift electrode (IDE) on the other side. The mobile ion conductor may be used as a transport medium to shuttle ions to and from the CNT and the IDE. The IDE may move the ions towards or away from the CNT.

8 Claims, 7 Drawing Sheets

(51) Int. Cl.
*G11C 13/02* (2006.01)
*G11C 13/00* (2006.01)
*H01L 51/05* (2006.01)

(52) U.S. Cl.
CPC ........ *H01L 45/126* (2013.01); *H01L 45/1226* (2013.01); *H01L 45/1233* (2013.01); *H01L 45/1273* (2013.01); *H01L 51/0508* (2013.01)

(56) References Cited

U.S. PATENT DOCUMENTS

| | | | | |
|---|---|---|---|---|
| 2011/0068323 | A1* | 3/2011 | Chen | H01L 29/1606 257/24 |
| 2014/0269002 | A1* | 9/2014 | Jo | H01L 45/145 365/148 |
| 2014/0319452 | A1* | 10/2014 | Seabaugh | H01L 29/1606 257/9 |

OTHER PUBLICATIONS

Adam W. Bushmaker, et al., "Radiation Effects in Individual CNT FETs: Single Ion Surface Adsorption and Switching", Nov. 17, 2015, The Aerospace Corporation, El Segundo, CA, US.

Adam W. Bushmaker, et al., "Single Event Effects in Carbon Nanotube Based Field Effect Transistors Under Energetic Particle Radiation: Evidence for a New Type of Single Event Effect", Jan. 27, 2015, The Aerospace Corporation, The University of Southern California, US.

Adam W. Bushmaker, et al., "Single Event Effects in Carbon Nanotube Based Field Effect Transistors Under Energetic Particle Radiation", Jul. 15, 2014, The Aerospace Corporation, The University of Southern California, US.

Adam W. Bushmaker, et al., "Single Event Effects in Carbon Nanotube Based Field Effect Transistors Under Energetic Particle Radiation", Jul. 11, 2014, The Aerospace Corporation, El Segundo, CA, US.

Adam W. Bushmaker, et al., "Single Ion Adsorption and Switching in Carbon Nanotubes", 2016, The Aerospace Corporation, The University of Southern California, US.

Adam W. Bushmaker, et al., "Single Ion Adsorption on Individual Isolated Single Walled Carbon Nanotubes", Aug. 12, 2016, The Aerospace Corporation, The University of Southern California, US.

Adam W. Bushmaker, et al., "Transient Radiation Effects in Carbon Nanotube Based Field Effect Transistors Under Energetic Particle Radiation", May 18, 2015, The Aerospace Corporation, The University of Southern California, US.

* cited by examiner

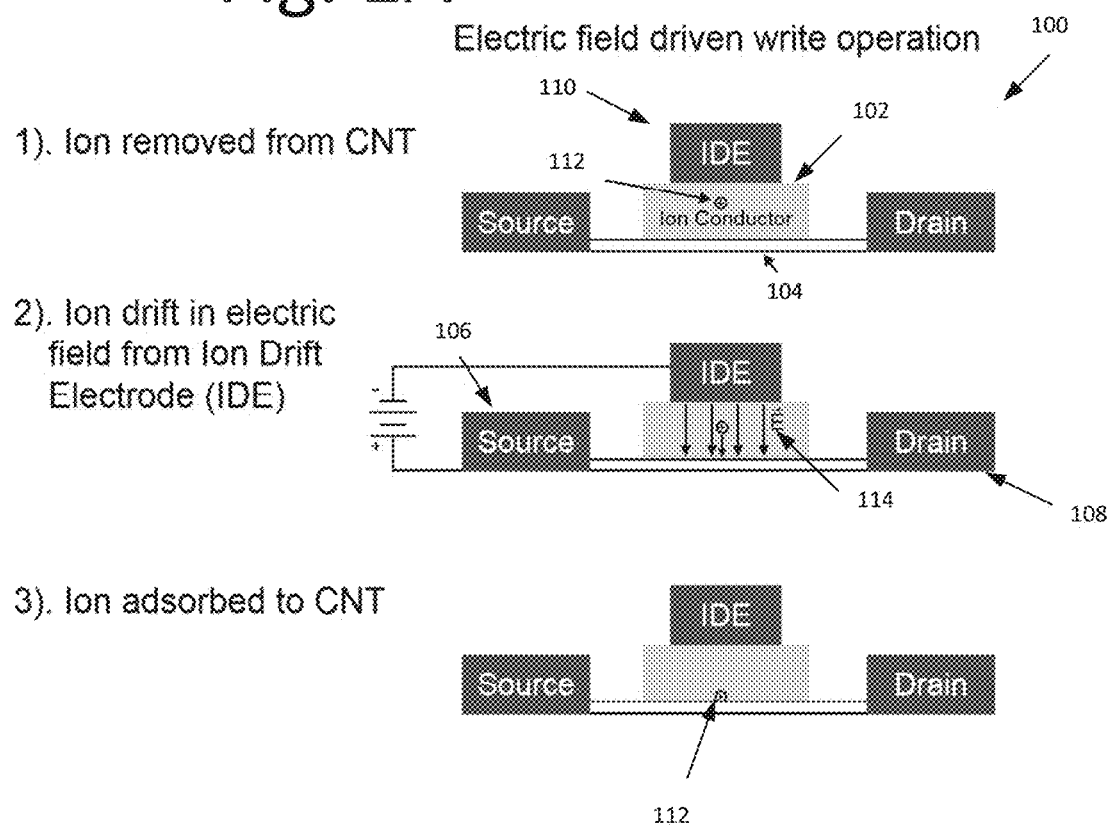

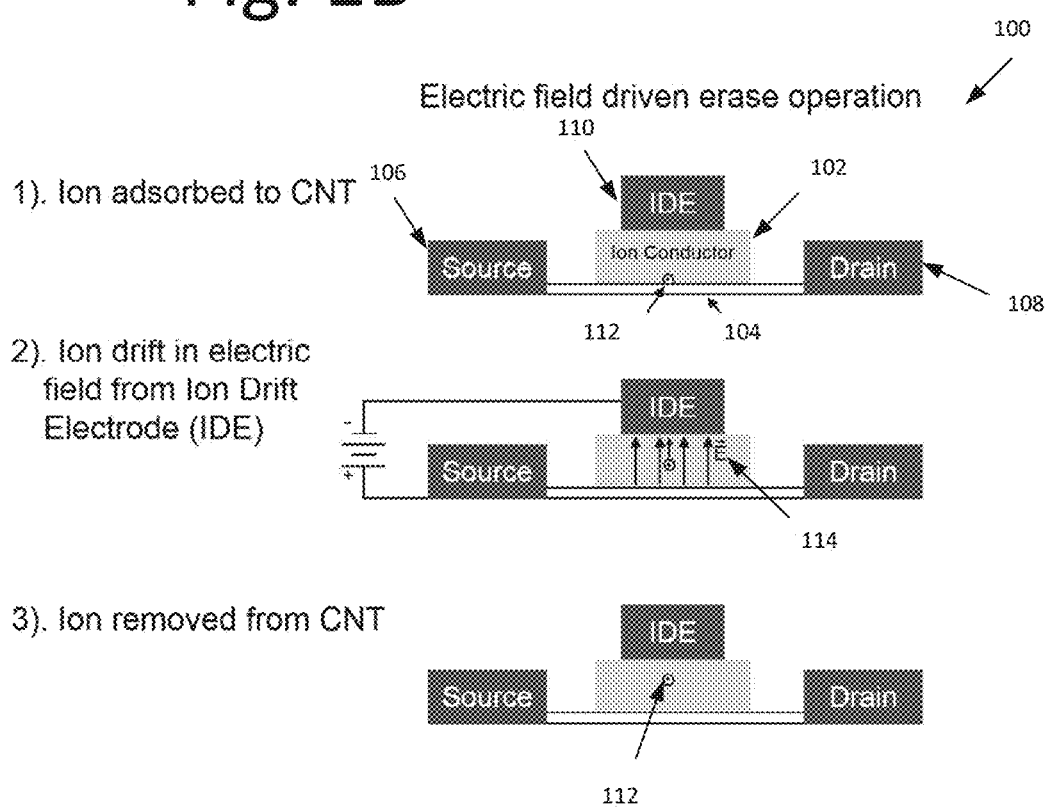

Scanning electron microscope image of CNT FET

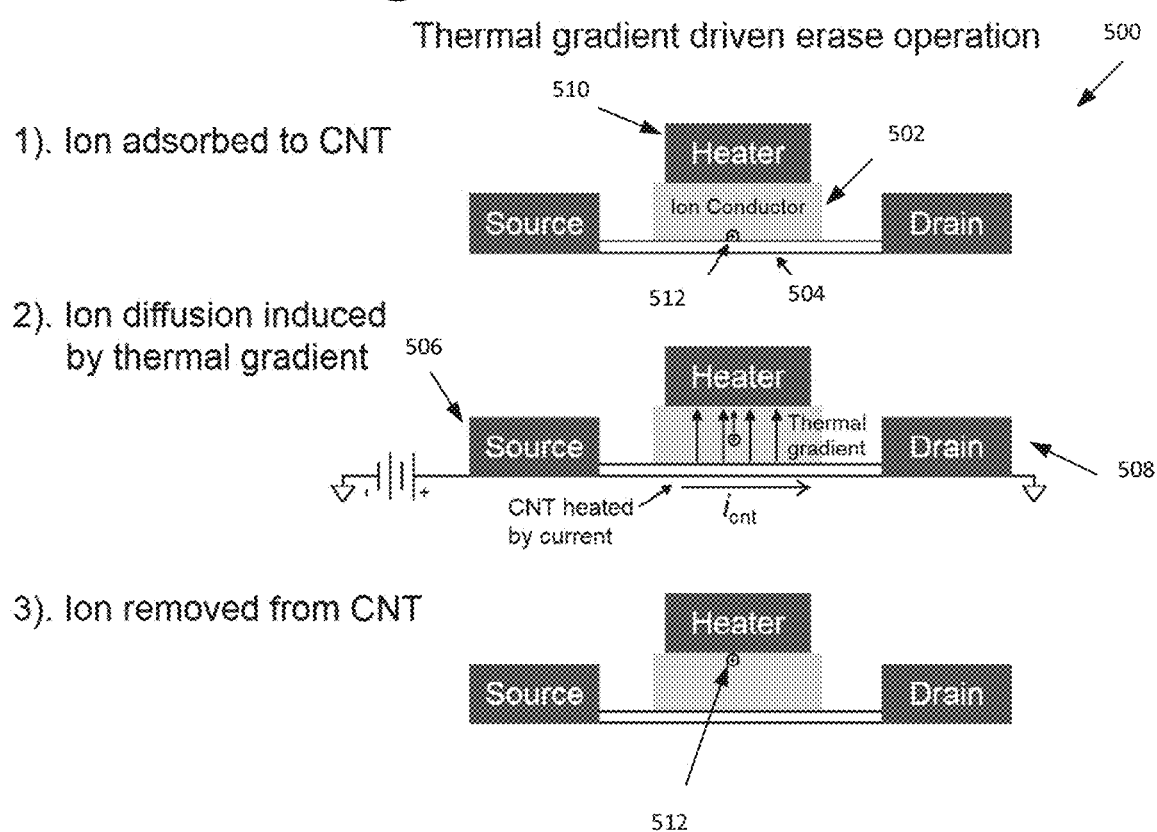

US 11,056,647 B2

ION-BASED NANOELECTRIC MEMORY

CROSS-REFERENCE TO RELATED APPLICATION

This application is a non-provisional application, and claims the benefit of U.S. Provisional Application No. 62/449,995, filed on Jan. 24, 2017. The subject matter thereof is hereby incorporated herein by reference in its entirety.

FIELD

The present invention relates to ion-based nanoelectric memory, and more particularly, to the use of ion transport as a memory/switch mechanism.

BACKGROUND

Non-volatile memory, or memory that can store information for long periods of time without a power supply, is currently dominated by flash memory and magnetic disk storage. Flash memory generally consists of a floating gate above a field effect transistor (FET) that can be electrically charged or discharged by application of a voltage. Magnetic disk storage (e.g., hard disk drives or HDD) uses magnetic domains on a spinning disk platter to store information.

Developing solid state technologies, such as NRAM, ReRAM, phase-change memory, and magnetic memory, offer various advantages over flash memory in terms of power consumption, write/read speed, durability, or radiation hardness. For example, flash memory has high power consumption, slow write times, and low reliability due to limited write cycle endurance. Emerging technologies are expected to address these problems. However, these emerging technologies are yet to be proven.

Thus, an alternative memory design may be beneficial.

SUMMARY

Certain embodiments of the present invention may provide solutions to the problems and needs in the art that have not yet been fully identified, appreciated, or solved by memory technologies. For example, some embodiments of the present invention generally pertain to ion-based nanoelectric memory (or memory device). The memory device may include a mobile ion conductor (or a solid electrolyte) in contact with a carbon nanotube ("CNT") on one side and an ion drift electrode ("IDE") on the opposite side. Connected to the CNT is a source and a drain. The mobile ion conductor may serve as a transport medium to shuttle one or more ions back and forth between the IDE and the CNT.

In an embodiment, an ion-based nonelectric memory device ("memory device") may include a mobile ion conductor in contact with a CNT on one side and an IDE on an opposite side. The memory device may also include a source and a drain connected to the CNT. The mobile ion conductor is a transport medium to shuttle one or more ions back and forth between the IDE and the CNT.

In another embodiment, a memory device may include a mobile ion conductor in contact with a CNT on one side and a heater on an opposite side. The memory device may also include a source and a drain connected to the CNT. The mobile ion conductor is a transport medium to shuttle one or more ions back and forth between the heater and the CNT.

In yet another embodiment, a memory device for shuttling one or more ions may include a mobile ion conductor adjacent to channel material. The memory device may also include an IDE or a heater on an opposite side of the mobile ion conductor. An electric field within the IDE, or a current applied to the heater or the channel material, moves the one or more ions back and forth between the IDE or the heater and the channel material.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIGS. 1A and 1B are circuit diagrams illustrating a memory device for shuttling ions back and forth between an IDE and a channel material, according to an embodiment of the present invention.

FIG. 5B is a circuit diagram illustrating a memory device using a heater to perform an erase operation, according to an embodiment of the present invention.

DETAILED DESCRIPTION OF THE EMBODIMENTS

Figure 2:
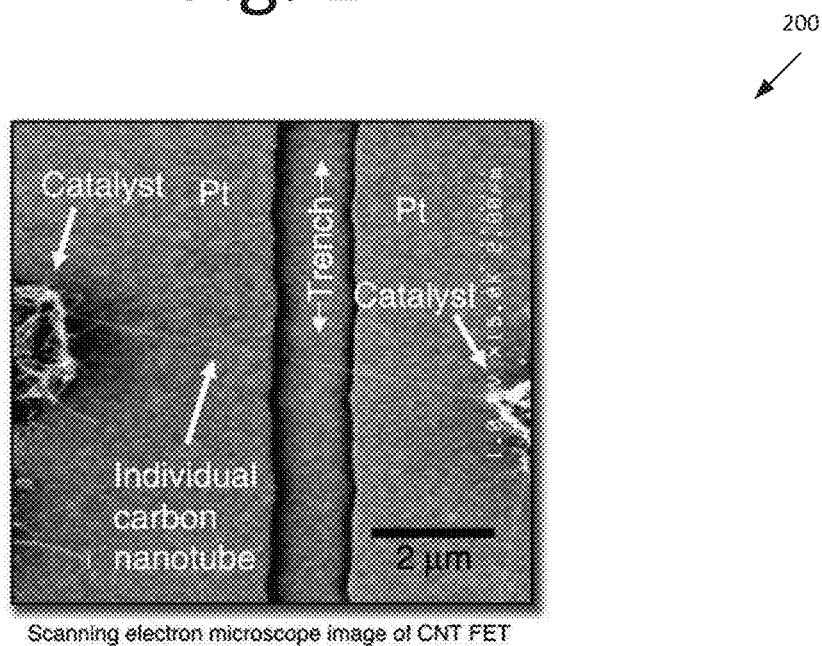
FIG. 2 illustrates a scanning electron microscope image of a CNT, according to an embodiment of the present invention.

Some embodiments of the present invention generally pertain to ion-based nanoelectric memory (or memory device). The memory device may include a mobile ion conductor that is in contact with a CNT. On the opposite side of the mobile ion conductor is an IDE. The mobile ion conductor, or a solid electrolyte in certain embodiments, may serve as a transport medium for shuttling ions back and forth between the IDE and the CNT. The IDE in some embodiments moves the ions around in the mobile ion conductor. For example, the IDE creates an electric field inside the mobile ion conductor to drive ion drift towards or away from the CNT. In another embodiment, a heater may be used to push the ions towards the CNT, which will be described in more detail below. In yet another embodiment, the CNT can be self-heated by application of electrical current to drive ions away from the CNT.

In another embodiment, the ion conductor may be a surface on which ions are mobile. In this embodiment, ions are conducted toward and away from the CNT on the surface of a material bordering the CNT.

FIGS. 1A and 1B are a circuit diagrams illustrating a memory device 100 for shuttling ions back and forth between an IDE 110 and a channel material 104, according to an embodiment of the present invention. In this embodiment, a mobile ion conductor 102 is connected to channel material 104. In some embodiments, channel material 104 may include CNT or any other material, the conductivity of which can be modulated by the addition of ions. This may include a semiconductor, for example. The use of a CNT is preferred in certain embodiments, because CNTs have a higher sensitivity due to their one-dimensional geometry. For purposes of explanation, the CNT will be used to describe the operation of memory device 100.

In this embodiment, CNT 104 is connected to two electrical contacts—a source 106 and drain 108—to measure its conductivity and is attached to a mobile ion conductor 102. Mobile ion conductor 102 may host a mobile ion 112, the physical location of which may store information. Mobile ion 112 may be a lithium ion, sodium ion, argon ion, oxygen ion, helium ion, nitrogen ion, or any other mobile ion species. For purposes of explanation, this application may refer mobile ion, or simply ion, 112 as a lithium ion. Lithium ions have an advantage in that chemistry and transport are well understood in many materials due to research in the area of lithium-ion batteries.

On the opposite side of, and not directly connected to, CNT 104 is IDE 110. IDE 110 may be used to move ions 112 in mobile ion conductor 102. For example, IDE 110 may move ions 112 in mobile ion conductor 102 to cause ions 112 to contact with CNT 104, lowering its conductivity, removing it from CNT 104, or restoring its conductivity back to the pristine state in some embodiments. Simply put, IDE 110 may create an electric field 114 to move ions 112 closer to, or away from, CNT 104.

Ions 112 may create barriers to charge transport in CNT 104. For example, ions 112 create an electrical potential barrier due to the electrostatic charge of the ion. When the ion is near CNT 104, for instance by being adsorbed or chemisorbed to the surface of CNT 104, these barriers to charge transport may reduce the conductivity of CNT 104 by blocking the flow of electrons or holes in CNT 104. Although CNT 104 is illustrated in FIG. 1, one of ordinary skill in the art would appreciate that ions (e.g., mobile ions) 112 may be used to store information in any type of system with any type of channel, and therefore, should not be limited to CNT.

Furthermore, in order for memory device 100, and more specifically, CNT 104 to be operational, CNT 104 may be required to undergo a preparation process (or surface treatment) for use as an ion actuated switch. Since there may be atmospheric contaminants on the surface of CNT 104, there is short residence times when CNT 104 is exposed with atmospheric contaminants. By placing CNT 104 in a vacuum chamber for a predefined period of time, followed by purging of the chamber with a dry gas such as argon or nitrogen, the lifetime of ion residency on CNT 104 is increased. In some embodiments, the purging of the chamber may include repeatedly pumping out the gas and refilling with the purge gas. In some embodiments, the purging of the chamber may include increasing the temperature of CNT 104 or the chamber itself during vacuum pumping.

FIG. 2 illustrates a scanning electron microscope image 200 of a CNT, which represents a constituent component of the present invention. Image 200 shows an individual CNT making electrical contact with platinum electrodes on both sides of a trench. These electrical contacts can be used to measure electrical conductivity of the CNT. In the bottom of the trench is a gate electrode. In an embodiment of the present invention, the gate electrode is replaced or combined with an ion drift electrode, and an ion conductor is inserted between the CNT and the IDE to facilitate ion transport. Also, an ion or ions are inserted into the ion conductor or onto the CNT to facilitate CNT switching.

Figure 3:
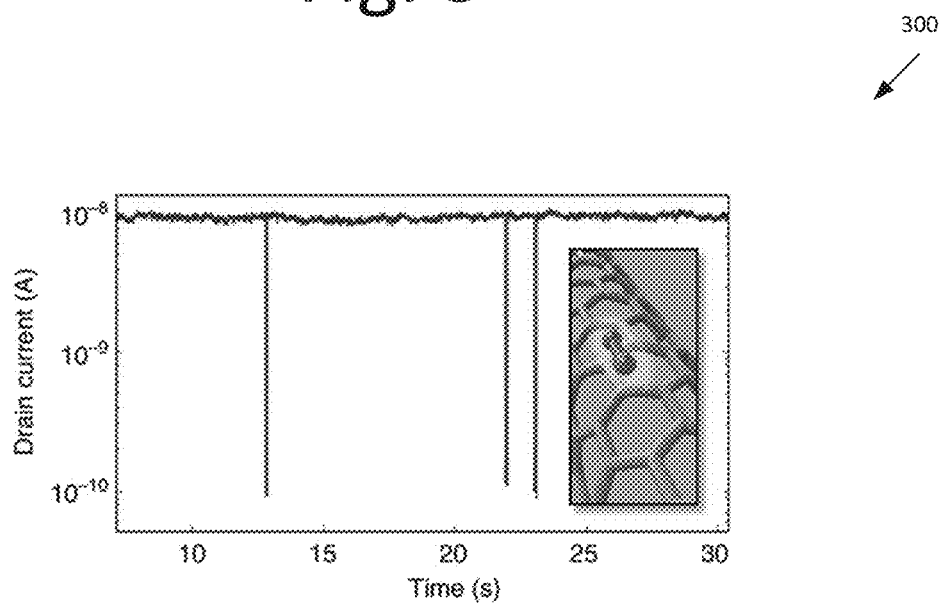
FIG. 3 is a graph illustrating electrical current passing through a CNT plotted versus time, according to an embodiment of the present invention.

FIG. 3 is a graph 300 illustrating showing electrical current passing through a CNT plotted versus time, according to an embodiment of the present invention. During exposure to ions, there are reductions in current due to interaction of the ions with the CNT. On the surface of a CNT, there may be contaminants, such as atmospheric contaminants, that are introduced onto the surface of a CNT which has been exposed to the atmosphere. This may include water, oxygen, nitrogen, or carbon dioxide, for example. If the CNT is exposed with atmospheric contaminants to ionized gas, there may be short ion residence times, as shown in graph 300. For example, in graph 300, the ion is absorbed onto the surface of the CNT, and the conductivity drops and may remain low for few tens to hundreds of milliseconds. The conductivity may then switch back when the ion leaves.

As mentioned above, by placing the CNT in a vacuum chamber for a predefined period of time and purging the chamber with a dry gas such as argon or nitrogen, the ion residency lifetime on the surface of the CNT may increase. This is key for a memory device, since the ion is required to remain on the surface of the CNT for a long duration of time. Thus, the CNT for one or more embodiments may be required to undergo a surface treatment for the memory device to be operational.

Figure 4:
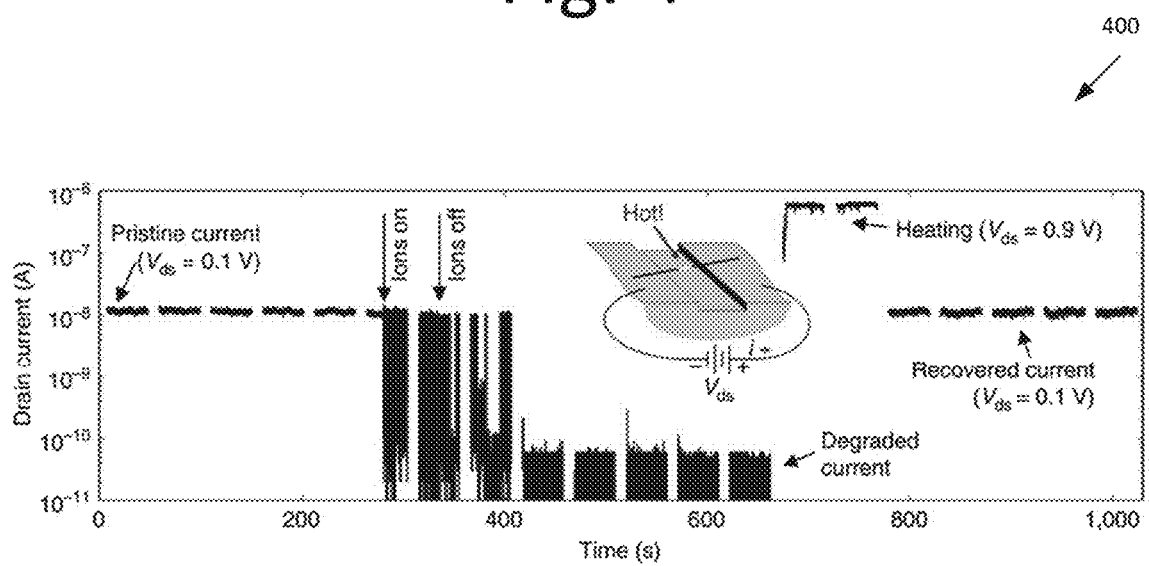
FIG. 4 is a plot illustrating reversible switching of a memory element, according to an embodiment of the present invention.

FIG. 4 is a plot 400 illustrating reversible switching of a memory element containing constituent components of the present invention, in which the ions for the write operation were supplied as gaseous ions generated by an external ion generator. Plot 400 shows that the current is initially in the pristine state. When voltage is applied to a piece of material (e.g., the CNT), the current is measured. As shown in plot 400, every time the CNT is exposed to the gaseous ions, the current degrades, thereby showing a change in conductivity. Plot 400 further shows that when the material is heated, the current reverts to the recovered state, i.e., the pristine state, demonstrating a thermal gradient driven erase operation. In an embodiment, an ion conductor and IDE or heater are placed adjacent to the CNT, to enable reversible switching of the memory element without a gaseous ion supply. Also, an ion or ions are inserted into the ion conductor or onto the CNT to facilitate CNT switching.

As discussed generally above, when a CNT is exposed to ions, the CNT may transition into a degraded conductivity state due to the presence of ions. To remove the ions from the CNT, thermal diffusion may be used. Thus, when the CNT is heated by the application of a small current, the ions are driven away from the CNT, and when the conductivity is measured with a small source-drain voltage, the CNT is recovered to its pristine state.

As briefly discussed above, a heater (see FIGS. 5A and 5B) may be used to drive the ions away from the heater and towards the CNT through thermal diffusion. In this embodiment, the IDE would be replaced or combined with a heater element. With the application of heat from the heater, a thermal gradient would be established between the heater and the CNT, causing the ion to move by thermal diffusion.

Figure 5A:
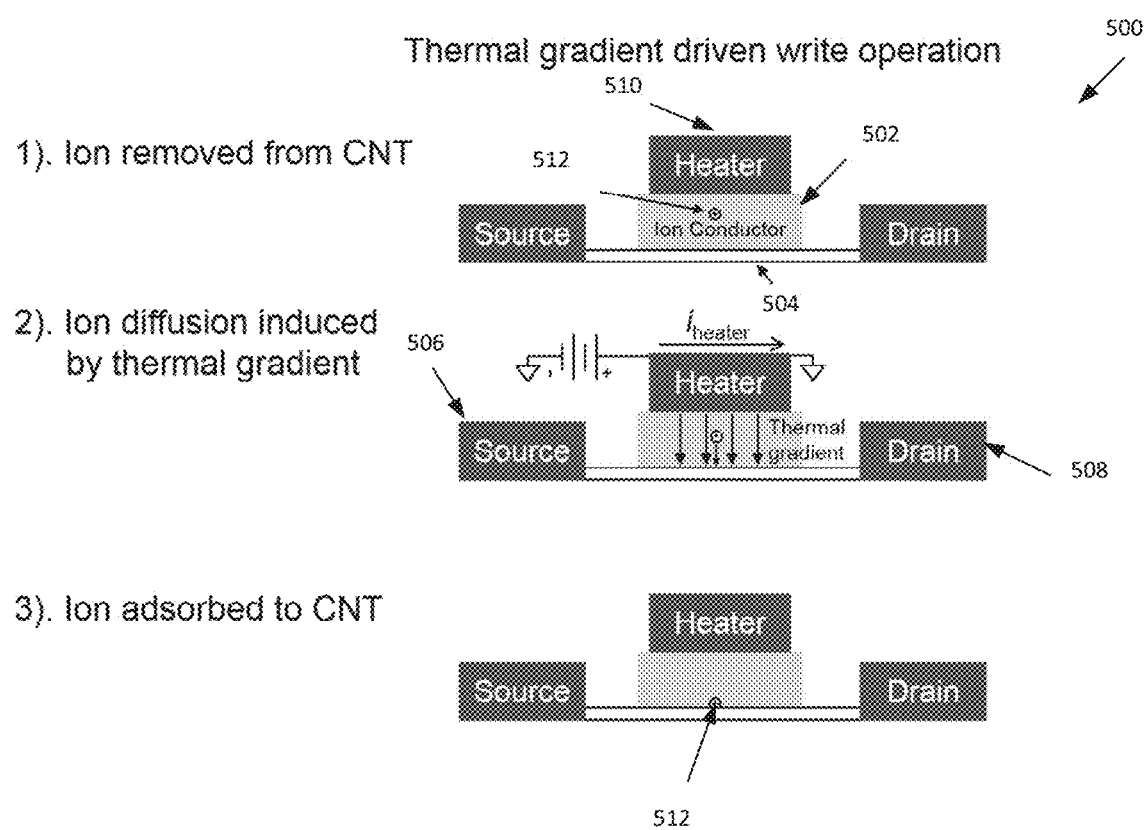
FIG. 5A is a circuit diagram illustrating a memory device using a heater to perform a write operation, according to an embodiment of the present invention.

FIGS. 5A and 5B illustrating a memory device 500 using a heater 510 to perform a write operation and an erase operation, according to an embodiment of the present invention. Similar to FIG. 1, a mobile ion conductor 502 is placed between a CNT 504 and a heater 504. CNT 504 is tied to a source 504 and a drain 508. In this embodiment, to perform a write operation (FIG. 5A), a current i is applied to heater 510. Heat emanating from heater 502 creates a thermal gradient, causing ions 504 to move in the direction of, and towards, CNT 504. To perform an erase operation (FIG. 5B), CNT 504 is heated by a current i creating a thermal gradient in the direction of heater 510. The thermal gradient causes ions 512 to move towards heater 510.

Returning to FIG. 1A, a readout may be performed by measuring the electrical conductivity of a readout channel affected by ions 112. This measurement may include applying a small bias voltage across drain 108 and source electrodes 106, and then measuring the resulting current flow through CNT 112. Because CNT 104 is a one-dimensional conductor in some embodiments, CNT 104 is extremely sensitive to barriers to electronic transport, even small ones caused by a single ion. This is because in one-dimensional conductors, the charge carriers have to pass through the barrier, and cannot pass around it as in 2D or 3D conductors.

In some further embodiments, a gate electrode may be added to the memory device (in addition to or as part of the IDE) to control the state of charge on the semiconductor channel, or CNT 104, thus making the device behave as a FET. This may have the advantage of allowing control over the charge state in CNT 104 to optimize sensitivity of CNT 104 to the mobile ions. CNT 104 is most sensitive to ions when the gate electrode voltage is adjusted to the threshold voltage of the memory device. In some embodiments, this voltage may be close to zero volts; however, for other materials combinations, this voltage may be non-zero.

A closer review of FIG. 1B reveals that an ion 112 is initially absorbed to CNT 104 in an embodiment. IDE 110 creates an electric field causing ion 112 to drift away from CNT 104. FIG. 1B also shows that ion 112 may be moved away from CNT 104, and near IDE 110 by way of electric field. Ion 112 does not have to move all the way to being in contact with IDE 110 for CNT 104 to be restored to a high-conductivity state. Ion 112 may only have to move a small distance away from CNT 104 so that the barrier to charge transport is removed and conductivity in CNT 104 is restored to near or at its pristine value. This distance may be very small, for instance as small as one nanometer. In the embodiment shown in FIG. 1A, the act of moving ion 112 to be in contact with CNT 104 is referred to as a write operation, and in FIG. 1B, the act of removing ion 112 from CNT 104 is referred to as an "erase" operation. However, in other embodiments this terminology may be reversed.

It will be readily understood that the components of various embodiments of the present invention, as generally described and illustrated in the figures herein, may be arranged and designed in a wide variety of different configurations. Thus, the detailed description of the embodiments, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention.

The invention claimed is:

1. A memory device for shuttling one or more mobile ions, comprising:
   a mobile ion switch comprising:
      three terminals;
      a mobile ion conductor adjacent to channel material, wherein the channel material is composed of a carbon nanotube (CNT); and
      an ion drift electrode ("IDE") on an opposite side of the mobile ion conductor, wherein
      an electric field within the IDE moves the one or more mobile ions back and forth between the IDE and the channel material.

2. The memory device of claim 1, wherein the channel material is connected to a source and a drain measuring conductivity of the channel material.

3. The memory device of claim 1, wherein a surface treatment is applied to a surface of the channel material to remove atmospheric contaminants in order to increase a lifetime of ion residency on the surface of the channel material.

4. The memory device of claim 1, wherein when the channel material is exposed to the one or more mobile ions, conductivity of the channel material degrades.

5. The memory device of claim 1, wherein when the one or more mobile ions are moved away from the channel material, conductivity of the channel material recovers to a pristine state.

6. The memory device of claim 1, further comprising:
   a gate electrode configured to control a state of charge of the channel material, causing the memory device to behave as a field effect transistor.

7. The memory device of claim 6, wherein a gate electrode voltage is adjusted to a threshold voltage of the memory device optimizing sensitivity of the channel material.

8. The memory device of claim 1, wherein the one or more mobile ions are inserted into the mobile ion conductor or onto the channel material to facilitate channel material switching.

* * * * *